(12) United States Patent
Miura

(10) Patent No.: US 8,026,569 B2
(45) Date of Patent: Sep. 27, 2011

(54) SEMICONDUCTOR DEVICE

(75) Inventor: Toshiaki Miura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 484 days.

(21) Appl. No.: 12/193,385

(22) Filed: Aug. 18, 2008

(65) Prior Publication Data

US 2009/0050998 A1  Feb. 26, 2009

(30) Foreign Application Priority Data

Aug. 22, 2007 (JP) ................ 2007-216327

(51) Int. Cl.
*H01L 27/07* (2006.01)
*H01L 31/06* (2006.01)

(52) U.S. Cl. ........ 257/477; 257/461; 257/525; 257/553; 257/555; 257/556

(58) Field of Classification Search ............... 257/461, 257/477, 225, E27.133, 525, 553, 555, 556
See application file for complete search history.

(56) References Cited

U.S. PATENT DOCUMENTS

| | | | |
|---|---|---|---|
| 5,798,560 A * | 8/1998 | Ohkawa et al. | 257/555 |
| 6,590,273 B2 * | 7/2003 | Okawa et al. | 257/544 |
| 2002/0079554 A1 * | 6/2002 | Okawa et al. | 257/565 |

FOREIGN PATENT DOCUMENTS

| | | |
|---|---|---|
| JP | 05-013800 A | 1/1993 |
| JP | 9-307086 A | 11/1997 |
| JP | 2002-217448 A | 8/2002 |
| JP | 2003-069071 A | 3/2003 |

* cited by examiner

*Primary Examiner* — Long Tran
(74) *Attorney, Agent, or Firm* — Sughrue Mion, PLLC

(57) ABSTRACT

In one embodiment of the present invention, a semiconductor device has a photodiode over a P-type substrate, an NPN transistor formed over the P-type substrate, an $N^+$-type buried region provided right under the NPN transistor as being buried in the P-type substrate, and a $P^+$-type buried region formed in the $N^+$-type buried region.

6 Claims, 10 Drawing Sheets

SEMICONDUCTOR DEVICE

This application is based on Japanese patent application No. 2007-216327 the content of which is incorporated hereinto by reference.

BACKGROUND

1. Technical Field

The present invention relates to a semiconductor device having a light receiving element on a substrate.

2. Related Art

Reproduction and recording by currently-disseminated CD (compact disk) and DVD (digital versatile disk) take place by irradiating laser beam on recoding media such as CD and DVD, and converting the reflected light from the recording media into electric signals by a light receiving element.

Only a few scattering would occur if surface condition of the recording media is smooth. The surface may, however, be roughened, scratched, deformed or get dust adhered thereon. In these cases, scattered light would occur due to non-smoothness of the surface, so that the light may enter circuit portions (composed of elements including transistor, capacitor, resistor and so forth) other than a photodiode portion of a light receiving element, and may be causative of malfunction of the circuit.

State of use of the recording media is not uniform, and this makes it difficult to keep smooth surfaces of the media. It is, therefore, necessary to develop a light receiving element not causative of malfunction even under incidence of scattered light.

In order to prevent the scattered light from entering, any unnecessary influences of the carriers, generated outside the region where the photodiode is formed, should be prevented. For this reason, the surface of the semiconductor circuit is covered with a light-shielding film composed of a metal interconnect layer such as an aluminum layer. Parasitic capacitance may, however, be arisen by the light-shielding film in the light receiving element, and may adversely affect the frequency characteristics over a wide frequency range.

Reasons for the drawback resides in generation and diffusion of carriers in the substrate, induced by light irradiated to portions of the substrate not shielded from light, such as side faces. Accordingly, the carriers migrate to the bipolar transistor and the capacitor. The migrated carriers flow through the circuit portion without being interrupted, and contribute as electric current. As a consequence, the current flows through the circuit portion, adversely affect the circuit operations, and may be causative of malfunction.

Japanese Laid-Open Patent Publication No. 2003-69071 describes that a PN junction is formed over the back surface of a silicon substrate as being opposed to the photodiode portion, so as to allow the PN junction portion to absorb unnecessary carriers, to thereby re-combine false carriers with the aid of electrodes on the back surface. In this way, the carriers are prevented from generating at the junction portion, and thereby the diffusive components may be suppressed.

Japanese Laid-Open Patent Publication No. 2002-217448 describes a semiconductor luminance sensor having PN junctions formed in the surficial portion under the photodiode portion and circuit portion, allowing the junctions to absorb unnecessary carriers. In this sensor, an NPN bipolar transistor is formed over a uniform P-type silicon substrate.

However, the conventional techniques described in the above literatures have had still some room of improvement in the aspects below.

As for Japanese Laid-Open Patent Publication No. 2003-69071, efficiency of absorption of unnecessary carriers may vary depending on wavelength of the incident light, so that malfunction as being affected by the unnecessary carriers may still occur if the device is used under a condition covering a broad wavelength band ranging from the visible to longer (600 nm to 1000 nm) region. In addition, the carriers generated by light incident on portions other than the photodiode portion may be absorbed only to a less efficient degree. The device is therefore restricted in that light should be incident on the photodiode portion.

Japanese Laid-Open Patent Publication No. 2002-217448 relates to a structure having the PN junctions formed in the surficial portion under the photodiode portion and circuit portion, allowing the junctions to absorb unnecessary carriers. The carriers generated under the bipolar transistor may have a tendency of being attracted by electric field of the depletion layer, but any other diffusive carriers may not be interrupted. The uninterrupted carriers may diffuse into the base region, induce electric current, and adversely affect the circuit.

The present invention is conceived after considering the above-described situation, and is to prevent the carriers, generated by incidence of light through the surface of the substrate, from diffusing into the circuit portion.

SUMMARY

According to the present invention, there is provided a semiconductor device having a light receiving element over a first-conductivity-type substrate, which includes:

a bipolar transistor formed over the first-conductivity-type substrate;

a second-conductivity-type buried region, reversed in the conductivity type from the first conductivity type, provided right under the bipolar transistor as being buried in the first-conductivity-type substrate; and a first-conductivity-type buried region provided in the second-conductivity-type buried region.

In the semiconductor device of the present invention, the first-conductivity-type buried region is provided in the second-conductivity-type buried region. Therefore, diffusion of the carriers in the first-conductivity-type substrate, generated by light coming through the surface of the substrate, may be blocked by a depletion layer in the PN junction portion formed at the interface between the second-conductivity-type buried region and first-conductivity-type buried region. On the other hand, the carriers generated at the PN junction portion are reversely biased by the PN junction, and are absorbed in the depletion layer in the PN junction portion. As a consequence, the carriers generated in the substrate and the PN junction portion may be prevented from diffusing into the transistor and the light-emitting element.

According to the present invention, there is provided also a method of manufacturing a semiconductor device having a light receiving element over a first-conductivity-type substrate, the method includes:

forming a second-conductivity-type buried region in the first-conductivity-type substrate;

forming a first-conductivity-type buried region in the second-conductivity-type buried region; and forming a bipolar transistor over the first-conductivity-type buried region.

Now the "first conductivity type" typically represents N-type, and the "second conductivity type" represents P-type. Conversely, the "first-conductivity-type" may represent P-type, and "second conductivity type" may represent N-type.

Still alternatively, directionality specified depth-wisely, laterally and vertically in the present invention is merely given for the convenience of simply explaining relative relations among the constituents, without limiting directions during manufacturing and use of the device when the present invention is carried out.

The present invention successfully prevents the carriers generated by light coming through the surface of a substrate, from diffusing towards the bipolar transistor.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
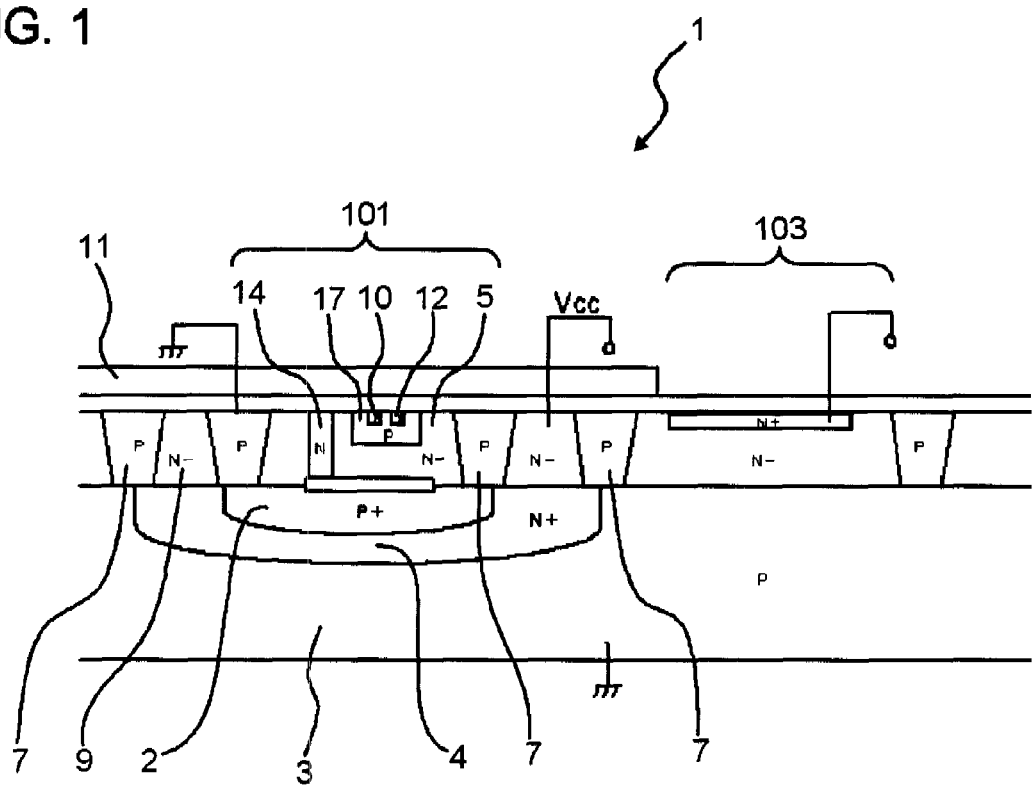
FIG. 1 is a drawing showing a configuration of a semiconductor device of a first embodiment.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Paragraphs below will explain the embodiments of the present invention, referring to the attached drawings. It is to be understood that, in all drawings, any similar constituents will be given with the similar reference numerals, so that explanation therefor will not be repeated.

First Embodiment

FIG. 1 is a drawing showing a configuration of a semiconductor device of a first embodiment. The semiconductor device 1 has a photodiode 103 over a P-type substrate 3, and further has an NPN transistor 101 formed over the P-type substrate 3, an N$^+$-type buried region 4 provided right under the NPN transistor 101 as being buried in the P-type substrate 3, and a P$^+$-type buried region 2 provided in the N$^+$-type buried region 4.

The NPN transistor 101 has an N$^-$-type well 5, a P-type body region 17 formed in the N$^-$-type well 5, a P-type base 10 composed of a P-type diffusion layer and an N-type emitter 12 composed of an N-type diffusion layer, both formed in the P-type body region 17, and an N-type collector 14 composed of an N-type diffusion layer formed as being spaced from the P-type body region 17. The N$^-$-type well 5 is provided as being brought into contact with the surface of the P$^+$-type buried region 2.

The surface of the NPN transistor 101 is covered with a light-shielding film 11. The light-shielding film 11 is composed of an interconnect layer using a metal such as aluminum.

Carriers may generate in the P-type substrate 3, as being induced by irradiation of light to the portions not shielded by the light-shielding film 11, or by irradiation of light of longer wavelength. The generated carriers diffuse in the P-type substrate 3. By providing the P$^+$-type buried region 2 in the N$^+$-type buried region 4, the carriers generated in the P-type substrate 3 may be interrupted by a depletion layer formed when the N$^+$-type buried region 4 and the P$^+$-type buried region 2 are biased.

By setting the N$^+$-type buried region 4 to a positive potential and by setting the P-type substrate 3 to the GND potential, the depletion layer in the PN junction portion may further be widened. By virtue of thus widened depletion layer, the carriers generated in the depletion layer can flow through the N$^+$-type buried region 4 to the P-type substrate 3. The carriers can no more diffuse into the NPN transistor 101 due to barrier of the depletion layer, so that generation of current affective to the circuit operations may be avoidable.

Next, operations of the semiconductor device 1 of this embodiment will be explained. The P-type base 10 and N-type emitter 12 are biased with potential $V_{be}$. If the N-type emitter 12 and N-type collector 14 are biased in this state, the carriers flow between the N-type emitter 12 and the N-type collector 14 depending on the bias. The NPN transistor 101 can thus operate.

On the other hand, the N$^-$-type epitaxial layer 9 and the P-type epitaxial layer 7 is biased with potential $V_{cc}$. This makes the circuit (not shown) operate. The N$^+$-type buried region 4 is connected to the N-epitaxial layer 9, and the P$^+$-type buried region 2 is connected to the P-type epitaxial layer 7. As a consequence, the N$^+$-type buried region 4 and the P$^+$-type buried region 2 are biased, and a depletion layer is formed at the boundary of the N$^+$-type buried region 4 and the P$^+$-type buried region 2. By virtue of this configuration, the carriers generated in the P-type substrate 3 may be interrupted, and thereby any adverse influences possibly exerted on the circuit operations may be suppressed.

Figure 2A:
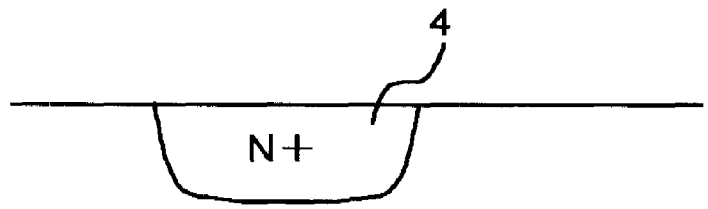
FIGS. 2A to 2C are sectional views showing process steps of a part of procedures for manufacturing the semiconductor device of the first embodiment.
Figure 2B:
Figure 2C:
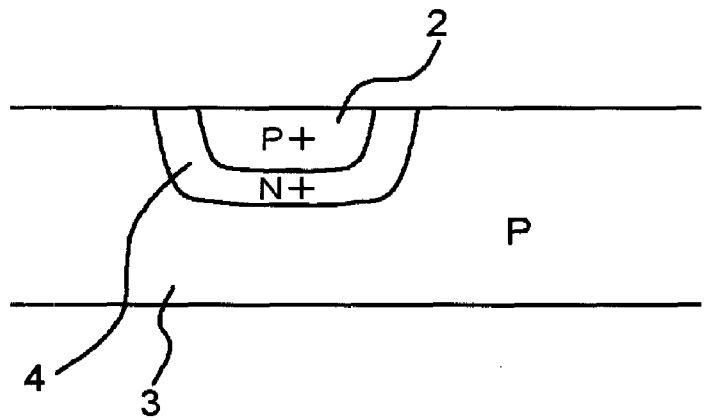

FIGS. 2A to 2C are sectional views showing process steps of a part of procedures for manufacturing the semiconductor device of this embodiment.

A P-type single crystal silicon substrate may be used as a material for composing the P-type substrate 3. The silicon substrate has the (100) surface of silicon crystal structure exposed to the surface thereof. An N-type impurity such as arsenic, antimony or the like is introduced by ion implantation into the P-type substrate 3 to thereby form the N$^+$-type buried region 4 (FIG. 2A).

Next, a P-type impurity such as boron or the like is introduced by ion implantation into the N$^+$-type buried region 4 to thereby form the P$^+$-type buried region 2 (FIG. 2B).

Next, an epitaxial silicon layer 13 is provided on the P-type substrate 3, and N areas and P areas are formed by ion implantation combined with photolithography over the P-type substrate 3. For example, the N$^-$-type well 5 is formed right above the P$^+$-type buried region 2, by ion implantation using arsenic. On the other hand, the N$^-$-type epitaxial layer 9 is formed as being brought into contact with the N⁺-type buried region 4, by ion implantation using phosphorus. In addition, the P-type epitaxial layer 7 is formed as being brought into contact with the P⁺-type buried region 2. The other region is doped to have P-type conductivity, typically manufactured by ion implantation of boron, thereby the P-type epitaxial layers 7 are formed (FIG. 2C).

Thereafter, impurities are introduced by ion implantation so as to form the P-type body region 17, the N-type collector 14, the P-type base 10 and the N-type emitter 12, to thereby form the NPN transistor 101. The photodiode 103 is also formed. By these processes, the semiconductor device 1 configured as shown in FIG. 1 is obtained.

The semiconductor device 1 may be configured typically as described below.

Figure 3:
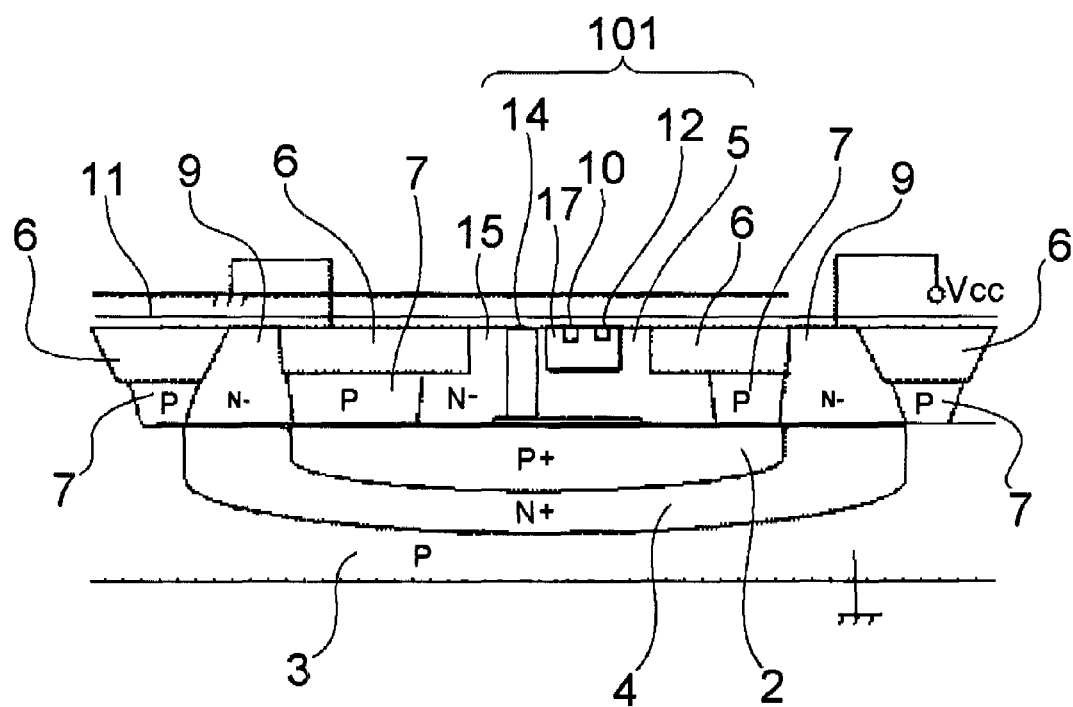
FIG. 3 is a drawing showing a specific example of the semiconductor device of the first embodiment.

FIG. 3 is a drawing showing a specific example of the semiconductor device 1. LOCOS layers 6 are provided on the P-type epitaxial layers 7.

The LOCOS (local oxidization of silicon) process is a technique of locally forming oxide film used for element isolation in semiconductor devices. The LOCOS process can shorten the distance between elements, and is a very efficient technique for an advanced scale of integration. For completion of the LOCOS layer, following the process shown in FIG. 2B, the epitaxial silicon layer 13 is covered with a nitride film ($Si_3N_4$). Succeeding high temperature annealing produces an oxide film in the region having no nitride film formed thereon. The oxide film serves as the LOCOS layers 6. The nitride film is then removed, impurities are introduced by ion implantation so as to form the P-type body region 17, the N-type well 5, the N-type collector 14, the P-type base 10 and the N-type emitter 12, to thereby construct the NPN transistor 101. By these processes, the NPN transistor 101 and other elements such as the photodiode 103 may be formed as being isolated from each other.

Next, effects of this embodiment will be explained. The semiconductor device 1 has the P⁺-type buried region 2 provided in the N⁺-type buried region 4. Carriers in the P-type substrate 3 generated by light coming through the surface of the P-type substrate 3 are then prevented from diffusing, by the depletion layer in the PN junction portion formed at the interface between the N⁺-type buried region 4 and the P⁺-type buried region 2. The carriers generated in the PN junction region are absorbed in the depletion layer in the PN junction portion, while being reversely biased by the PN junction. As a consequence, the carriers generated in the P-type substrate 3 and the PN junction portion may be prevented from diffusing into the circuits such as the NPN transistor 101 and the photodiode 103.

Figure 8:
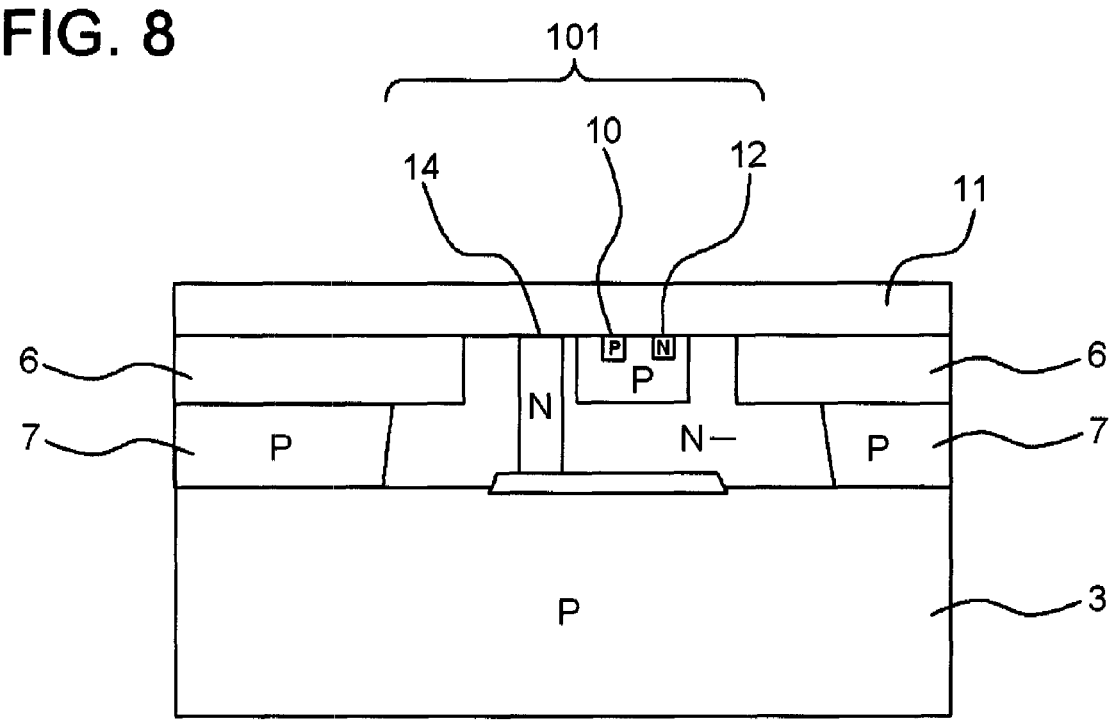
FIG. 8 is a drawing showing a configuration of a conventional semiconductor device.

FIG. 8 is a drawing showing a configuration of a conventional semiconductor device. The conventional configuration is different from the configuration of this embodiment in that the NPN transistor 101 is formed over the P-type substrate 3 which is uniform, and has neither N⁺-type buried region 4 nor P⁺-type buried region 2 formed therein, unlike the semiconductor device 1 of this embodiment shown in FIG. 3. Carriers may therefore generate as being induced by incident light coming typically through regions of the P-type substrate 3 not shielded by the light-shielding film 11. The generated carriers diffuse to reach the NPN transistor 101, and contribute as electric current flowing towards the circuit portion. The current adversely affects the circuit operations.

In contrast in the semiconductor device of this embodiment, the carriers generated in the depletion layer in the PN junction as being induced by light coming through the surface of the P-type substrate 3 are reversely biased by the PN junction, and absorbed in the depletion layer in the PN junction portion. The generated carriers may be interrupted so as to avoid influence on the NPN transistor 101. In addition, the N-type well 5 is provided as being brought into contact with the surface of the P⁺-type buried region 2. The bipolar transistor 101 and the P-type substrate 3 are therefore completely isolated by the PN junction portion formed between the N⁺-type buried region 4 and the P⁺-type buried region 2.

The N⁺-type buried region 4 and the P⁺-type buried region 2 configuring the interruption structure for the carriers may be formed without seriously altering the process steps. Quality and characteristics of the device may therefore be improved without being elevated in the cost. This embodiment may be applicable to photodiode 103 adapted to a wide wavelength range over the visible to longer wavelength region.

Second Embodiment

Figure 4:
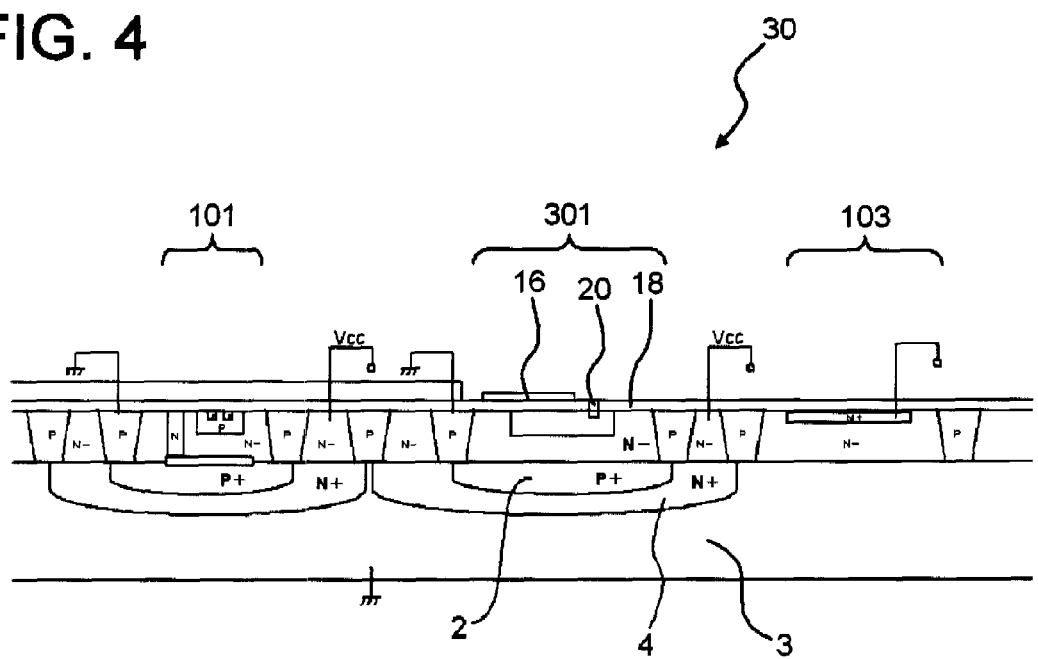
FIG. 4 is a drawing showing a configuration of a semiconductor device of a second embodiment.

FIG. 4 is a drawing showing a configuration of a semiconductor device of a second embodiment. A semiconductor device 30 has a capacitor 301 as being added to the semiconductor device 1 of the first embodiment. The capacitor 301 is provided in parallel with the NPN transistor 101, over the P-type substrate 3. The device has the N⁺-type buried region 4 provided right under the capacitor 301 as being buried in the P-type substrate 3, and the P⁺-type buried region 2 provided in the N⁺-type buried region 4 right under the capacitor 301.

The capacitor 301 has an electrode 16 while placing an insulating interlayer 18 thereunder. Also an N⁺-type extraction region 20 is provided. Electric current flows in the circuit depending on potential at the N⁺-type extraction region 20.

A method of manufacturing the semiconductor device 30 will be explained below. The N⁺-type buried region 4 and the P⁺-type buried region 2 are formed similarly to as described in relation to the semiconductor device 1, the epitaxial silicon layer 13 is provided on the P-type substrate 3, and N areas and P areas are formed by ion implantation combined with photolithography over the P-type substrate 3. The N⁺-type extraction region 20 is formed by implanting an impurity. The NPN transistor 101 and the photodiode 103 are constructed, then covered with the insulating interlayer 18, mounting the electrode 16 to thereby form the capacitor 301.

Figure 5:
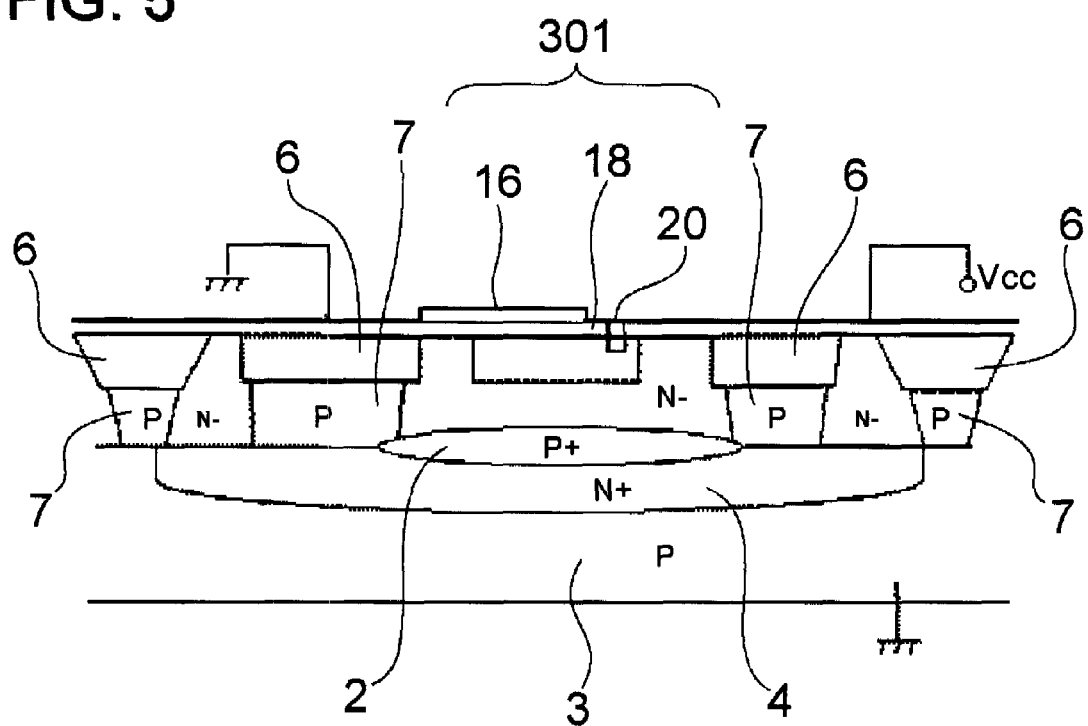
FIG. 5 is a drawing showing a specific example of the semiconductor device of the second embodiment.

The semiconductor device 30 may alternatively be configured typically as described below. FIG. 5 is a drawing showing a specific example of configuration of the semiconductor device 30 of the second embodiment. The LOCOS layers 6 are provided to the P-type epitaxial layers 7.

Also the LOCOS layers 6 in this embodiment are formed similarly to the method adopted to the semiconductor device 1. In this way, the capacitor 301 may be formed as being isolated from other elements such as the NPN transistor 101, the photodiode 103 and so forth.

Effects of this embodiment will be explained in the next. The effects similar to those explained in the first embodiment may be obtained also for diffusion of carriers towards the capacitor 301. The carriers may generate in the P-type substrate 3, as being induced by irradiation of light to the portions not shielded by the light-shielding film 11, or by irradiation of light of longer wavelength. The generated carriers diffuse in the P-type substrate 3. Because the semiconductor device 30 has the P⁺-type buried region 2 provided in the N⁺-type buried region 4, the carriers may be interrupted by a depletion layer formed at the interface between the N⁺-type buried region 4 and the P⁺-type buried region 2, when the N⁺-type buried region 4 and the P⁺-type buried region 2 are biased.

Figure 9:
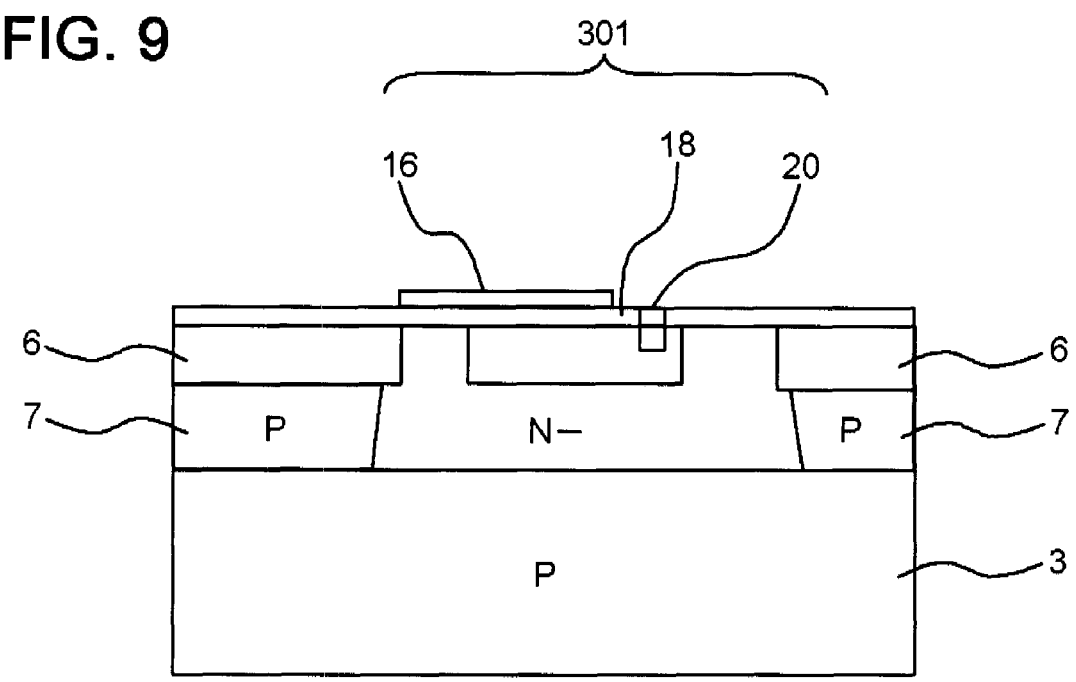
FIG. 9 is a drawing showing another configuration of a conventional semiconductor device.

FIG. 9 is a drawing showing another configuration of a conventional semiconductor device. The conventional configuration is different from the configuration of this embodiment in that the NPN transistor 101 is formed over the P-type substrate 3 which is uniform, and has neither N+-type buried region 4 nor P+-type buried region 2 formed right under the capacitor 301, unlike the semiconductor device 30 of this embodiment shown in FIG. 5.

The carriers generate as being induced by light coming through the portions of the P-type substrate 3 not shielded from light. The generated carriers flow to the GND and do not affect the circuit portions if the N+-type extraction region 20 has the GND potential, whereas if the N+-type extraction region 20 has a potential higher than the GND, the carriers may migrate due to the potential, and contribute as electric current flowing towards the circuit portion. The current adversely affects the circuit operations.

In contrast, according to the configuration of this embodiment, the P+-type buried region 2 is provided in the N+-type buried region 4. The carriers generated in the P-type substrate 3 as being induced by light coming through the surface of the substrate are prevented from diffusing by the depletion layer in the PN junction portion formed at the interface between the N+-type buried region 4 and the P+-type buried region 2 formed therein. The carriers generated in the PN junction portion are reversely biased by the PN junction, and absorbed in the depletion layer in the PN junction portion. In addition, the N-type well 5 is provided as being brought into contact with the surface of the P+-type buried region 2. The capacitor 301 and the P-type substrate 3 are therefore completely isolated by the PN junction portion formed between the N+-type buried region 4 and the P+-type buried region 2. In this way, the carriers generated in the P-type substrate 3 are prevented from diffusing into the circuit portion such as transistors.

By setting the N+-type buried region 4 to a positive potential and by setting the P-type substrate 3 to the GND potential, the depletion layer in the PN junction portion may be widened. By virtue of thus widened depletion layer, the carriers generated in the depletion layer can flow through the N+-type buried region 4 to the P-type substrate 3, without adversely affecting the circuit operations. The carriers can no more diffuse into the NPN transistor 101 due to barrier of the depletion layer, so that generation of current affective to the circuit operations may be avoidable.

Third Embodiment

Figure 6:
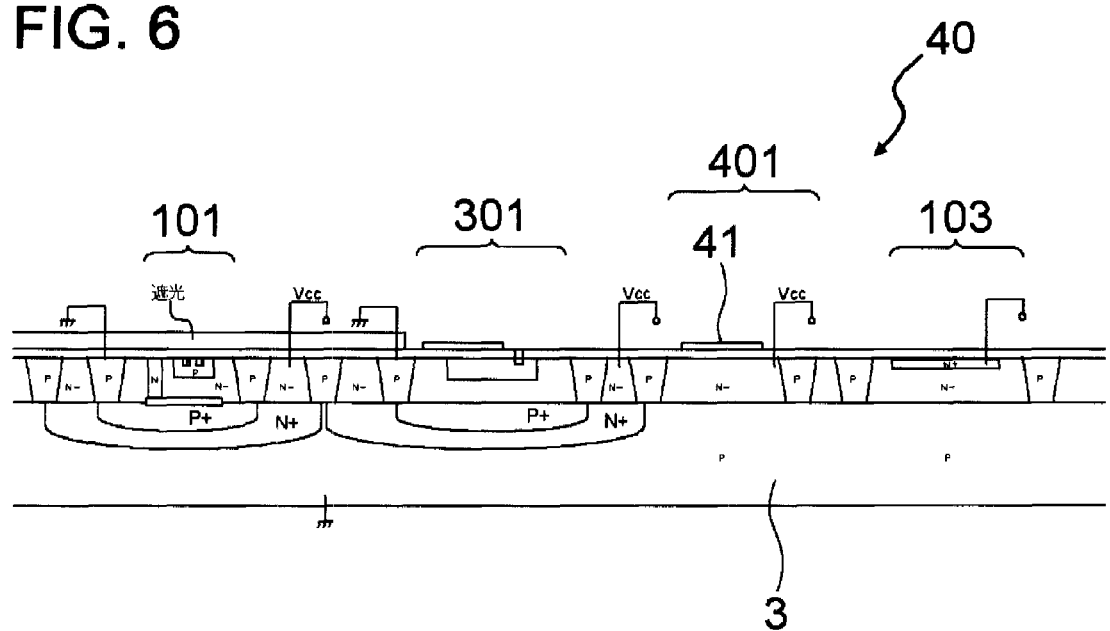
FIG. 6 is a drawing showing a configuration of a semiconductor device of a third embodiment.

FIG. 6 is a drawing showing a configuration of a semiconductor device of a third embodiment. A semiconductor device 40 has a resistor 401 as being added to the semiconductor device 30 of the second embodiment. The resistor 401 is provided in parallel with the capacitor 301, over the P-type substrate 3. The LOCOS layer is not provided right under the resistor 401.

Figure 7:
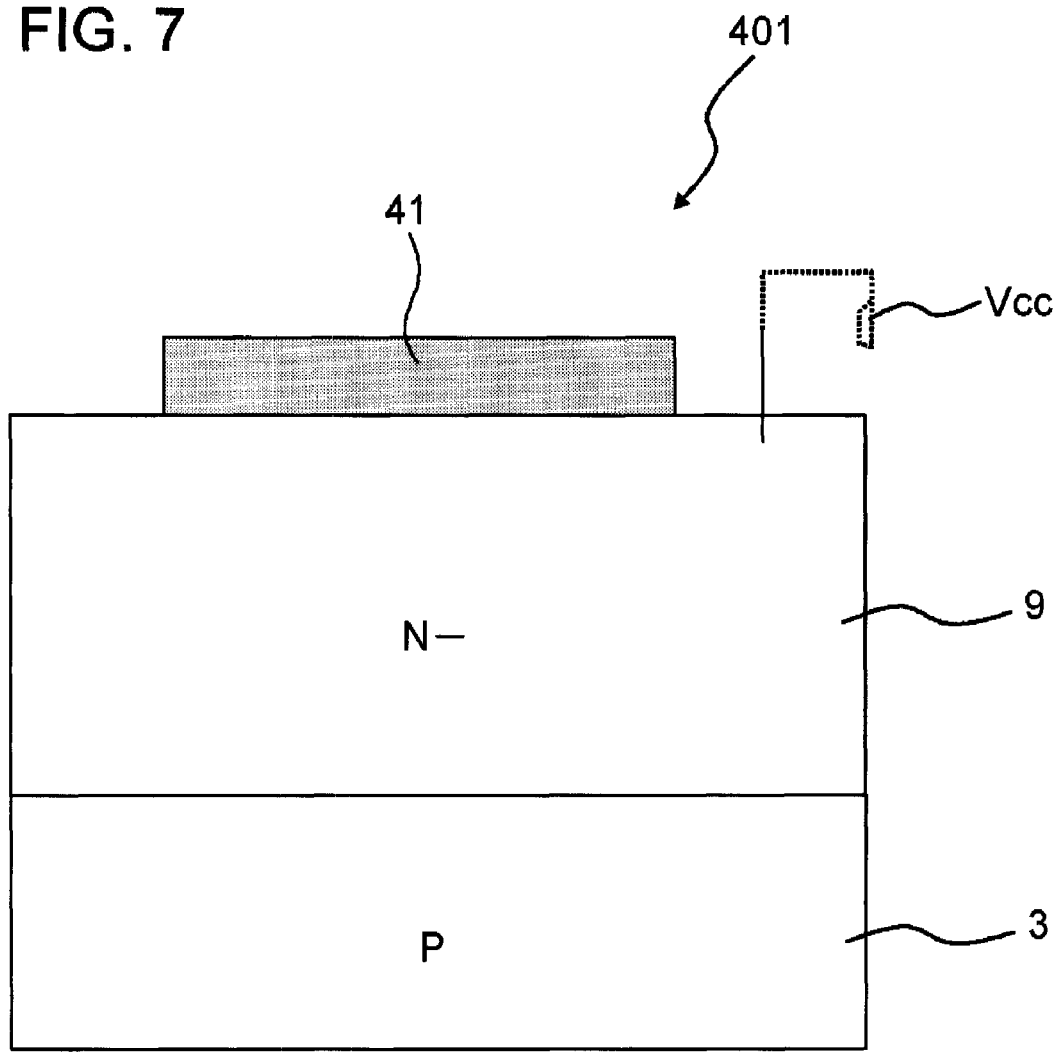
FIG. 7 is a drawing showing a resistor portion of the semiconductor device of the third embodiment.

FIG. 7 is a drawing showing the resistor 401 of the semiconductor device 30 of this embodiment. The N−-type epitaxial layer 9 is formed over the P-type substrate 3. A polysilicon layer 41 is provided over the N−-type epitaxial layer 9.

Figure 10:
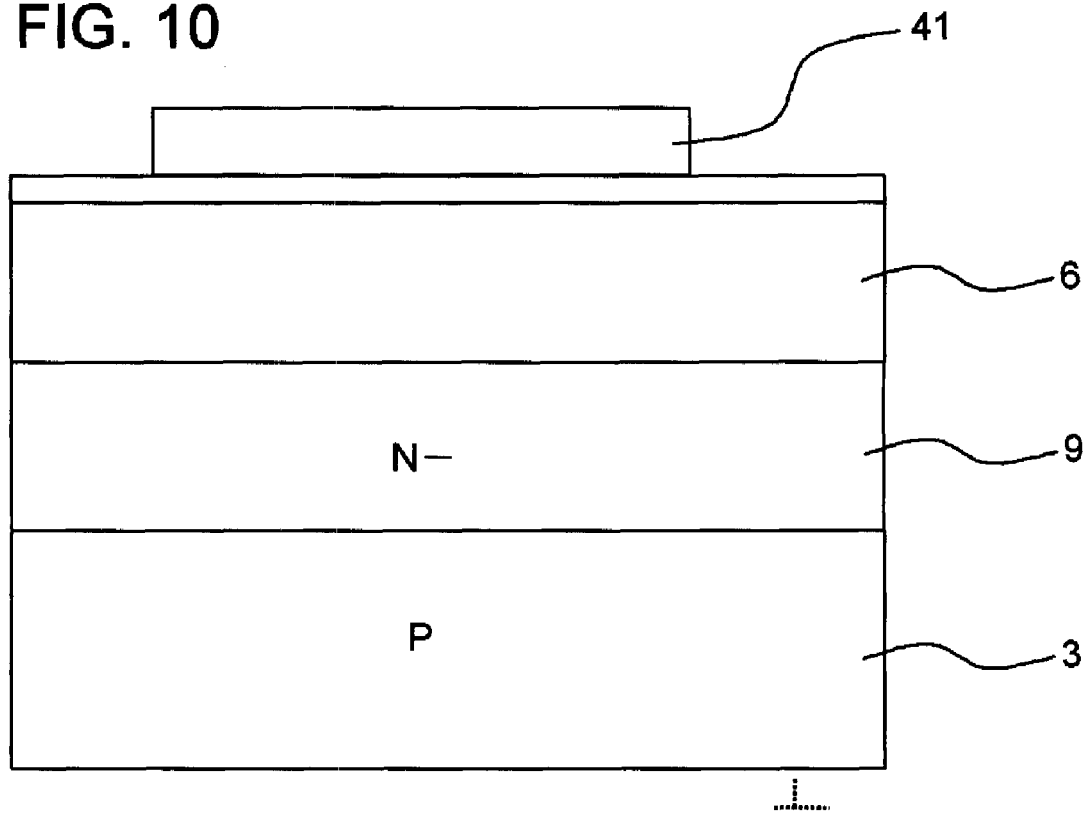
FIG. 10 is a drawing showing a resistor portion of the conventional semiconductor device.

FIG. 10 is a drawing showing a resistor in a conventional semiconductor device. The LOCOS layer 6 is formed right under the conventional polysilicon layer 41. The PN junction is formed also conventionally by the N−-type epitaxial Layer 9 and the P-type substrate 3, but the N−-type epitaxial layer 9 cannot be connected under a positive potential due to existence of the LOCOS layer 6, so that the carriers generated in the polysilicon layer 41 cannot fully be absorbed.

In contrast, the semiconductor device 40 successfully absorbs the carriers generated in the depletion layer in the PN junction portion, by disusing the LOCOS layer and by connecting the N−-type epitaxial layer 9 under a positive potential.

The embodiments of the present invention have been described referring to the attached drawings, merely as examples of the present invention, while allowing adoption of various configurations other than those described in the above.

For example, the embodiments, having been explained referring to the NPN transistor, may alternatively adopt configurations using a PNP transistor.

Also, the present invention allows adoption of the configurations as below.

(1) A method of manufacturing a semiconductor device having a light receiving element over a first-conductivity-type substrate, the method comprising:
forming a second-conductivity-type buried region in said first-conductivity-type substrate;
forming a first-conductivity-type buried region in said second-conductivity-type buried region; and
forming a bipolar transistor over said first-conductivity-type buried region.

(2) The method of manufacturing a semiconductor device in the aforementioned (1),
wherein said forming said bipolar transistor is such as forming a second-conductivity-type collector layer as being brought into contact with the surface of said first-conductivity-type buried region, so as to form a bipolar transistor having said second-conductivity-type collector layer.

It is apparent that the present invention is not limited to the above embodiment, that may be modified and changed without departing from the scope and spirit of the invention.

What is claimed is:

1. A semiconductor device having a light receiving element over a first-conductivity-type substrate, comprising:
a bipolar transistor formed over said first-conductivity-type substrate, the bipolar transistor having a second-conductivity-type well and a collector composed of a second-conductivity-type diffusion layer provided as being brought into contact with said second-conductivity-type well;
a second-conductivity-type buried region, reversed in the conductivity type from the first conductivity type, provided right under said bipolar transistor as being buried in said first-conductivity-type substrate; and
a first-conductivity-type buried region provided in said second-conductivity-type buried region and being brought into contact with said second-conductivity-type well.

2. The semiconductor device as claimed in claim 1, wherein said bipolar transistor further comprises:
a first-conductivity-type body region formed in said second-conductivity-type well; and
a base composed of a first-conductivity-type diffusion layer and an emitter composed of a second-conductivity-type diffusion layer, both formed in said first-conductivity-type body region;
wherein said collector is formed as being spaced from said first-conductivity-type body region.

3. The semiconductor device as claimed in claim 2, further comprising:
a capacitor provided in parallel with said bipolar transistor, on said first-conductivity-type substrate;
an additional second-conductivity-type buried region provided right under said capacitor as being buried in said first-conductivity-type substrate; and an additional first-conductivity-type buried region provided in said additional second-conductivity-type buried region right under said capacitor.

4. The semiconductor device as claimed in claim 3, further comprising a resistor portion provided in parallel with said capacitor, on said first-conductivity-type substrate, and having no LOCOS film provided right under said resistor portion.

5. The semiconductor device as claimed in claim 1, wherein said bipolar transistor is an NPN transistor.

6. The semiconductor device as claimed in claim 1, wherein a reverse bias is applied between said first-conductivity-type substrate and said second-conductivity-type buried region.

* * * * *